(12) United States Patent
Nakajima

(10) Patent No.: US 7,006,029 B2
(45) Date of Patent: Feb. 28, 2006

(54) MONOLITHIC SEMICONDUCTOR DEVICE CAPABLE OF SUPPRESSING MISMATCHES BETWEEN REPETITIVE CELLS

(75) Inventor: Yuji Nakajima, Kanagawa (JP)

(73) Assignee: NEC Electronics Corp., Kanagawa (JP)

( * ) Notice: Subject to any disclaimer, the term of this patent is extended or adjusted under 35 U.S.C. 154(b) by 0 days.

(21) Appl. No.: 10/839,087

(22) Filed: May 5, 2004

(65) Prior Publication Data
US 2004/0222911 A1 Nov. 11, 2004

(30) Foreign Application Priority Data
May 9, 2003 (JP) ............................. 2003-132385

(51) Int. Cl.
*H03M 1/36* (2006.01)
(52) U.S. Cl. ...................................... 341/158; 341/159
(58) Field of Classification Search ................ 341/158, 341/159
See application file for complete search history.

(56) References Cited

U.S. PATENT DOCUMENTS

| 5,175,550 A | 12/1992 | Kattmann et al. |
| 5,835,048 A * | 11/1998 | Bult ............................. 341/159 |
| 6,480,136 B1 * | 11/2002 | Kranz et al. ................. 341/159 |
| 2004/0041721 A1 * | 3/2004 | Jiang et al. .................. 341/158 |

FOREIGN PATENT DOCUMENTS

JP  2004-312061  11/2004

* cited by examiner

*Primary Examiner*—Howard L. Williams
(74) *Attorney, Agent, or Firm*—Muirhead and Saturnelli, LLC

(57) ABSTRACT

A monolithic semiconductor device is constructed by a plurality of repetitive cells each including one circuit section and one current source for supplying a current to said circuit section, and a plurality of first impedance circuits, each connected between the current sources of two of the repetitive cells, for reducing the effect of cell mismatches among the repetitive cells.

8 Claims, 14 Drawing Sheets

MONOLITHIC SEMICONDUCTOR DEVICE CAPABLE OF SUPPRESSING MISMATCHES BETWEEN REPETITIVE CELLS

BACKGROUND OF THE INVENTION

1. Field of the Invention

The present invention relates to a monolithic semiconductor device (chip) including repetitive cells.

2. Description of the Related Art

For example, a flash or parallel-type analog/digital (A/D) converter is constructed by a large number of repetitive cells. That is, such an A/D converter is constructed by comparators for comparing an analog input voltage with reference voltages, latch circuits for latching the output signals of the comparators, and a binary encoder for encoding the output signals of the latch circuits. In this case, the comparators form repetitive cells in a monolithic semiconductor device. Each of the comparators is constructed by one differential pair and one current source for supplying a current thereto. This will be explained later in detail.

In the above-mentioned A/D converter, when mismatches resulting from deviations from nominal occur between the repetitive cells, the differential and integral linearity would deteriorate.

In order to suppress the above-mentioned mismatches between the repetitive cells, an impedance network such as a resistor is connected between outputs of differential pairs (see: U.S. Pat. No. 5,175,550). This also will be explained later in detail.

In the above-described prior art, however, although the mismatches resulting from deviations from nominal occurring between the differential pairs of the comparators can be suppressed, the mismatches resulting from deviations from nominal occurring between the current sources of the comparators cannot be suppressed, which still would deteriorate the differential and integral linearity of the above-mentioned A/D converter.

SUMMARY OF THE INVENTION

It is an object of the present invention to provide a monolithic semiconductor device capable of suppressing mismatches between repetitive cells, particularly, between their current sources.

According to the present invention, a monolithic semiconductor device is constructed by a plurality of repetitive cells. Each of the repetitive cells includes one circuit section and one current source for supplying a current to the circuit section. Also, a plurality of impedance circuits are connected between the current sources of two of the repetitive cells, to reduce the effect of cell mismatches among the repetitive cells.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art monolithic semiconductor devices will be explained with reference to FIGS. 1, 2, 3, 4, 5, 6A and 6B.

Figure 1:
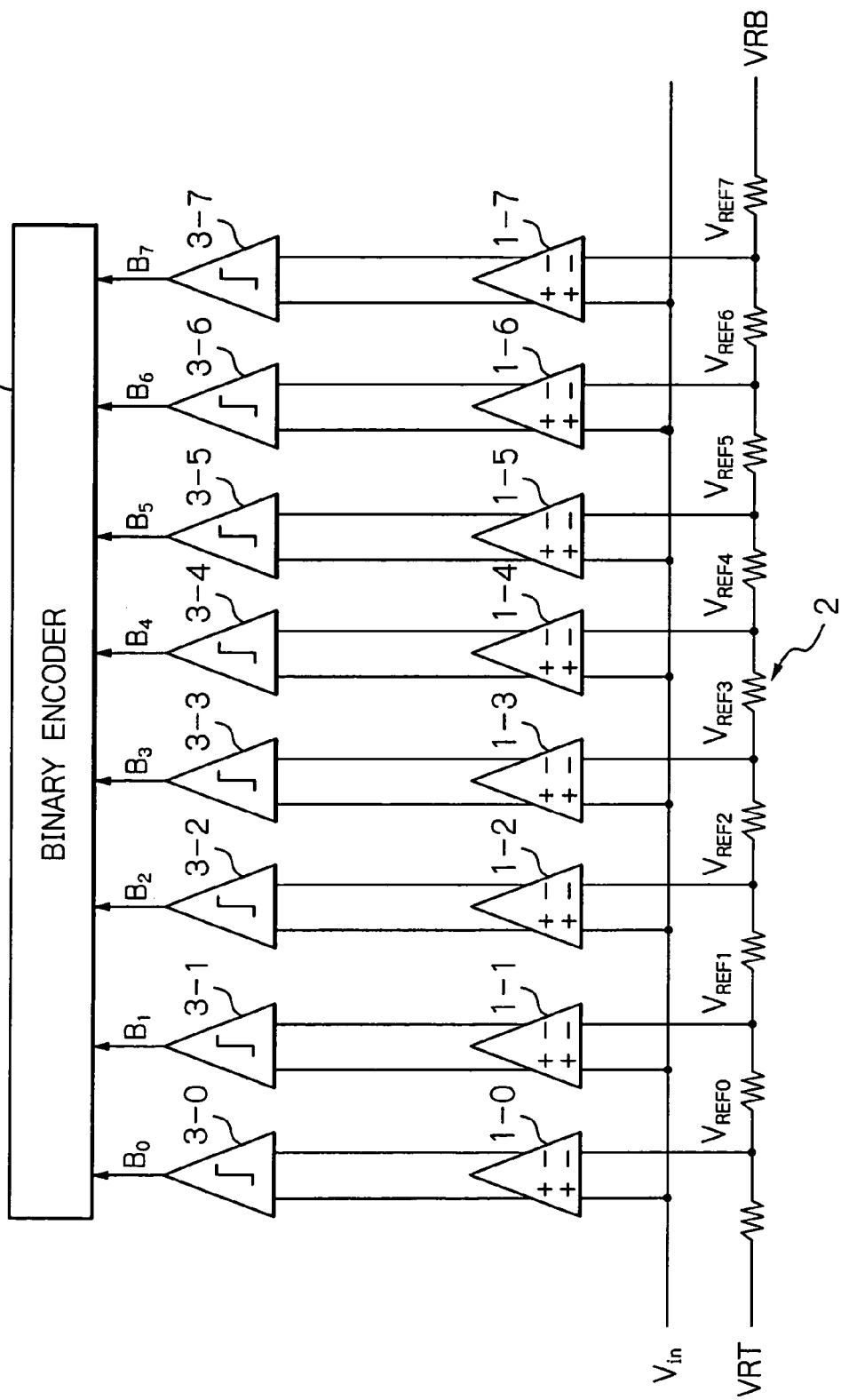
FIG. 1 is a circuit diagram illustrating a 3-bit flash or parallel-type A/D converter to which a first prior art monolithic semiconductor device is applied.

In FIG. 1, which illustrates a 3-bit flash or parallel-type A/D converter to which a first prior art monolithic semiconductor device is applied, reference numerals $1\text{-}0, 1\text{-}1, \ldots, 1\text{-}7$ designate comparators for comparing an analog input voltage $V_{in}$ with reference voltages $V_{REF0}, V_{REF1}, \ldots V_{REF7}$, respectively, which are generated from a resistor string circuit 2 powered by two voltages VRT and VRB. Also, latch circuits $3\text{-}0, 3\text{-}1, \ldots, 3\text{-}7$ are connected to the comparators $1\text{-}0, 1\text{-}1, \ldots, 1\text{-}7$, respectively, to latch the output signals of the comparators $1\text{-}0, 1\text{-}1, \ldots, 1\text{-}7$ and generate binary output signals $B_0, B_1, \ldots, B_7$ which are supplied to a binary encoder 4. Note that the comparators $1\text{-}0, 1\text{-}1, \ldots, 1\text{-}7$ form repetitive cells integrated in a monolithic semiconductor device.

Figure 2:
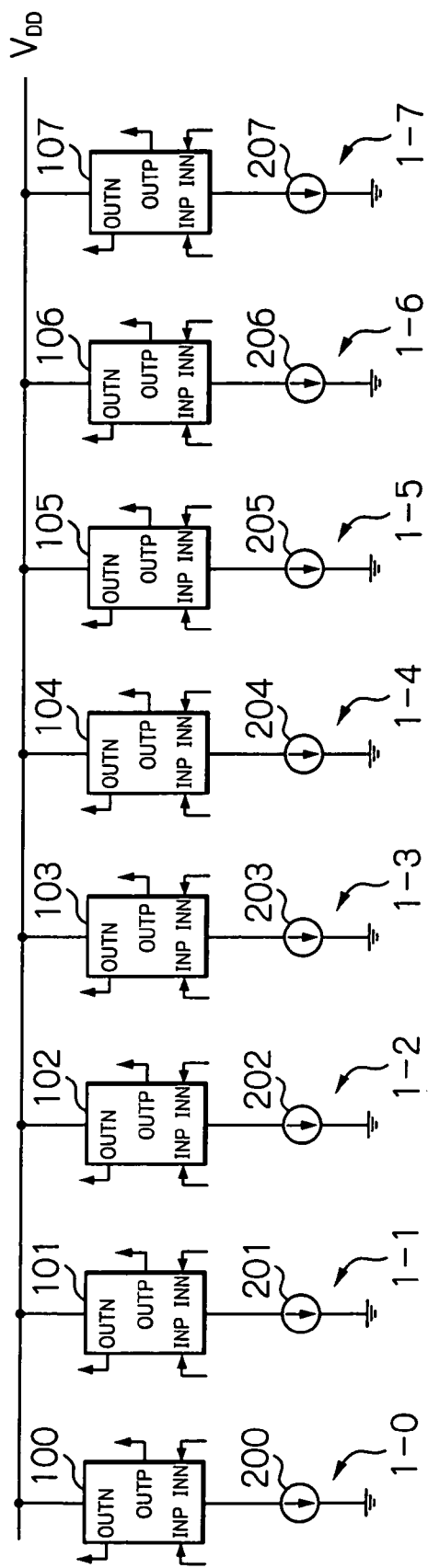
FIG. 2 is a detailed block circuit diagram of the monolithic semiconductor device of FIG. 1.
Figure 2:
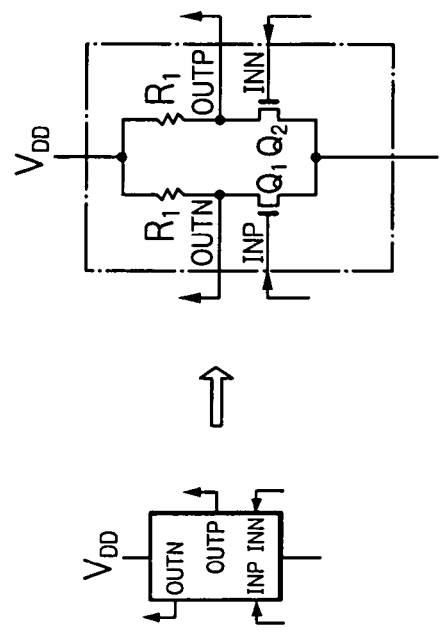

In FIG. 2, which is a detailed block circuit of the monolithic semiconductor device of FIG. 1, each of the comparators $1\text{-}1, 1\text{-}2, \ldots, 1\text{-}7$ is constructed by one differential pair $10i$ ($i=0, 1, \ldots, 7$) formed by N-channel MOS transistors $Q_1$ and $Q_2$ having a common source, and resistors $R_1$ connected to drains of the transistors $Q_{1\ and\ Q2}$, respectively, and one current source $20i$ ($i=0, 1, \ldots, 7$).

The operation of the monolithic semiconductor device of FIG. 2 is explained next with reference to FIG. 3 where there are a large number of comparators (cells) that are indefinite in extent.

Figure 3:
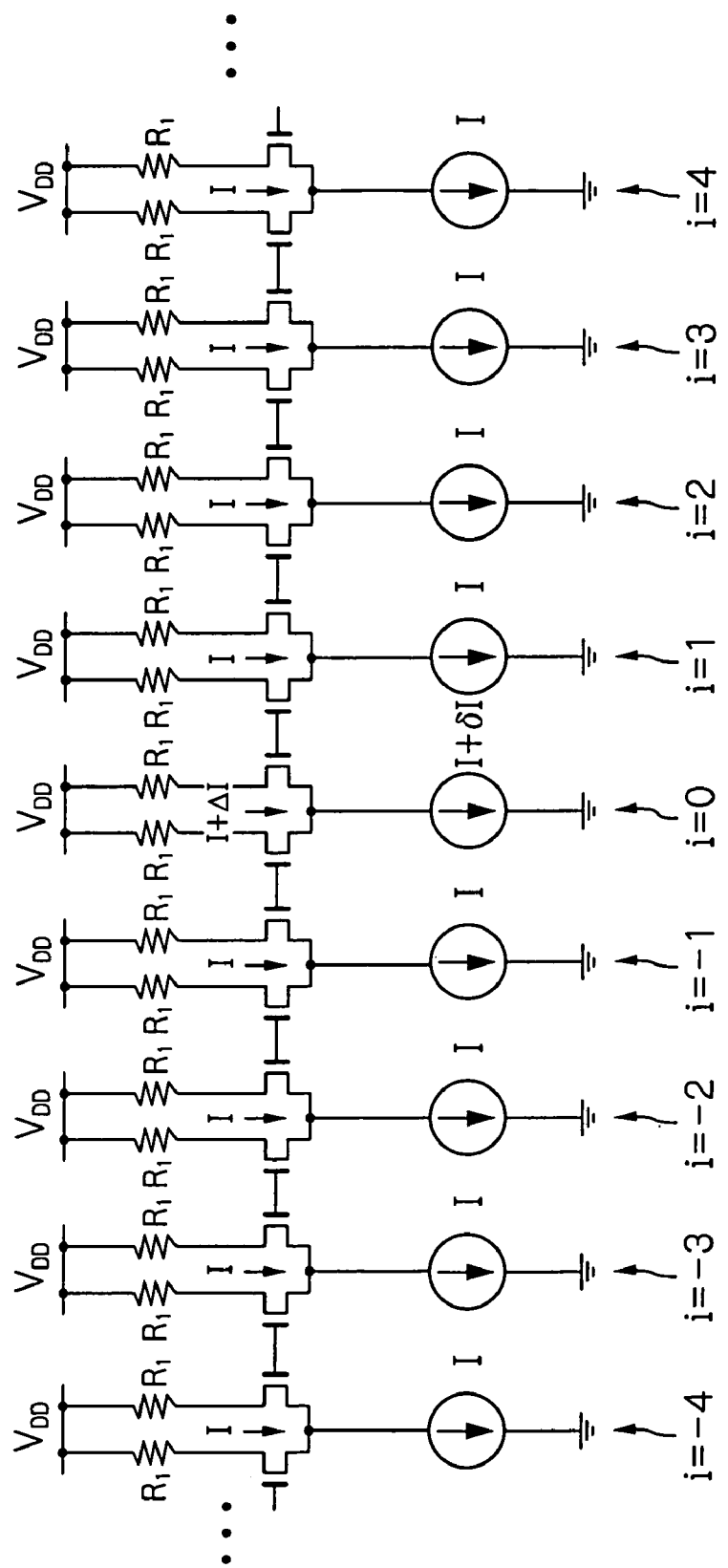
FIG. 3 is an equivalent circuit diagram for explaining the operation of the monolithic semiconductor device of FIG. 2.

In FIG. 3, assume that a current flowing through the differential pair or current source of a specified comparator $1\text{-}i$ is deviated from nominal and can be defined as $I+\Delta I$ or $I+\delta I$ where $\Delta I$ or $\delta I$ is an error current. Here, the current flowing through the differential pair is defined as the sum of currents flowing through the transistors $Q_{1\ and\ Q2}$. In this case, since the error current $\Delta I$ or $\delta I$ is never dispersed into the other comparators (cells), $\Delta I = \delta I$. Therefore, mismatches resulting from deviations from nominal occurring between the cells remain. For example, differences in output common voltage or output dynamic response between the cells would remain because the current of each cell changes independently. This would deteriorate the differential and integral linearity of the A/D converter of FIG. 1.

Figure 4:
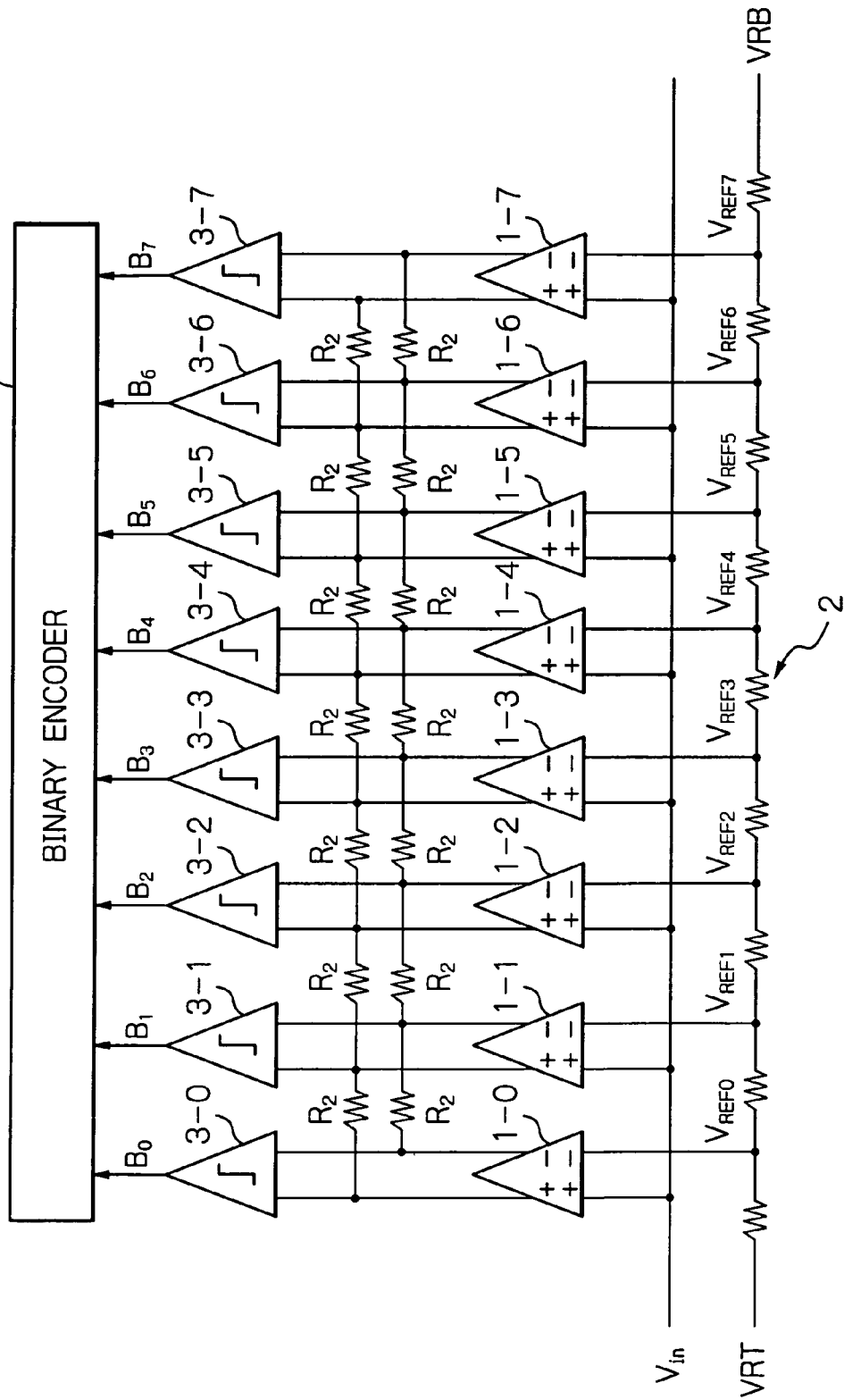
FIG. 4 is a circuit diagram illustrating a 3-bit flash or parallel A/D converter to which a second prior art monolithic semiconductor device is applied.
Figure 5:
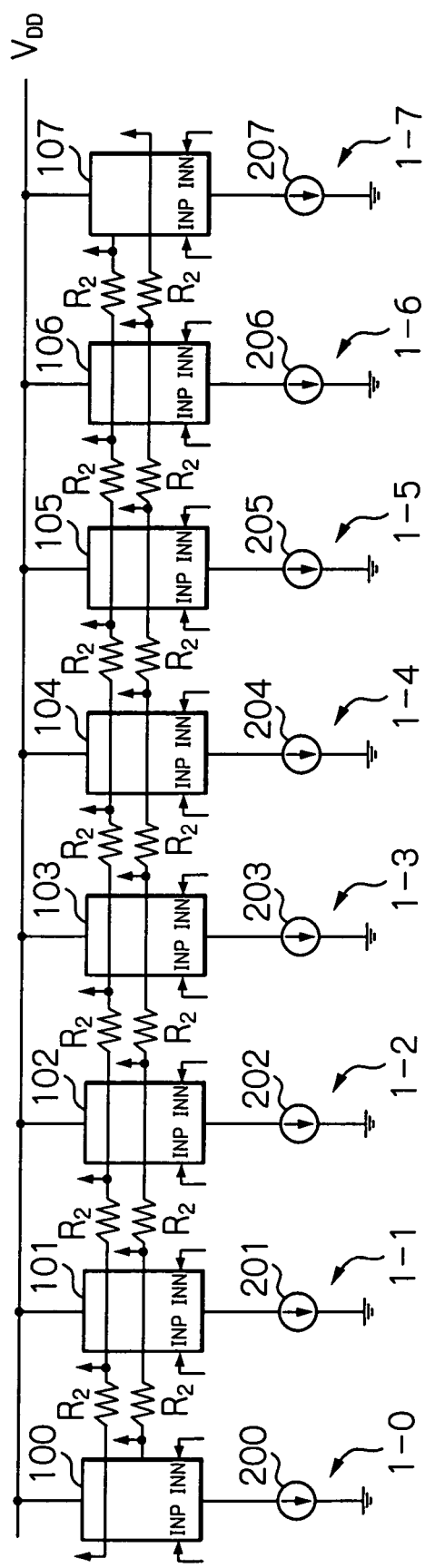
FIG. 5 is a detailed block circuit diagram of the monolithic semiconductor device of FIG. 4.
Figure 5:
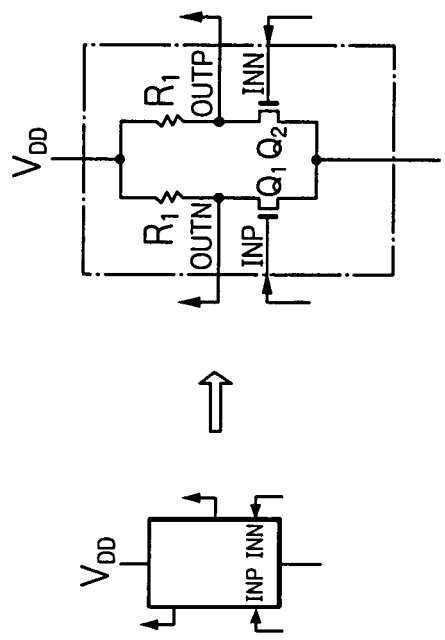

In FIG. 4, which illustrates a 3-bit flash or parallel-type A/D converter to which a second prior art monolithic semiconductor device is applied, resistors $R_2$ as impedance circuits are connected between the outputs of the comparators 1-0, 1-1, . . . , 1-7 of FIG. 1 (see: U.S. Pat. No. 5,175,550). That is, as illustrated in FIG. 5, which is a detailed block circuit diagram of the monolithic semiconductor device of FIG. 4, the output OUTP of one differential pair 10$i$ is connected via the resistor $R_2$ to the output OUTP of its adjacent differential pair 10$i$−1 or 10$i$+1. Also, the output OUTN of one differential pair of 10$i$ is connected via the resistor $R_2$ to the output OUTN of its adjacent differential pair 10$i$−1 and 10$i$+1.

Figure 6A:
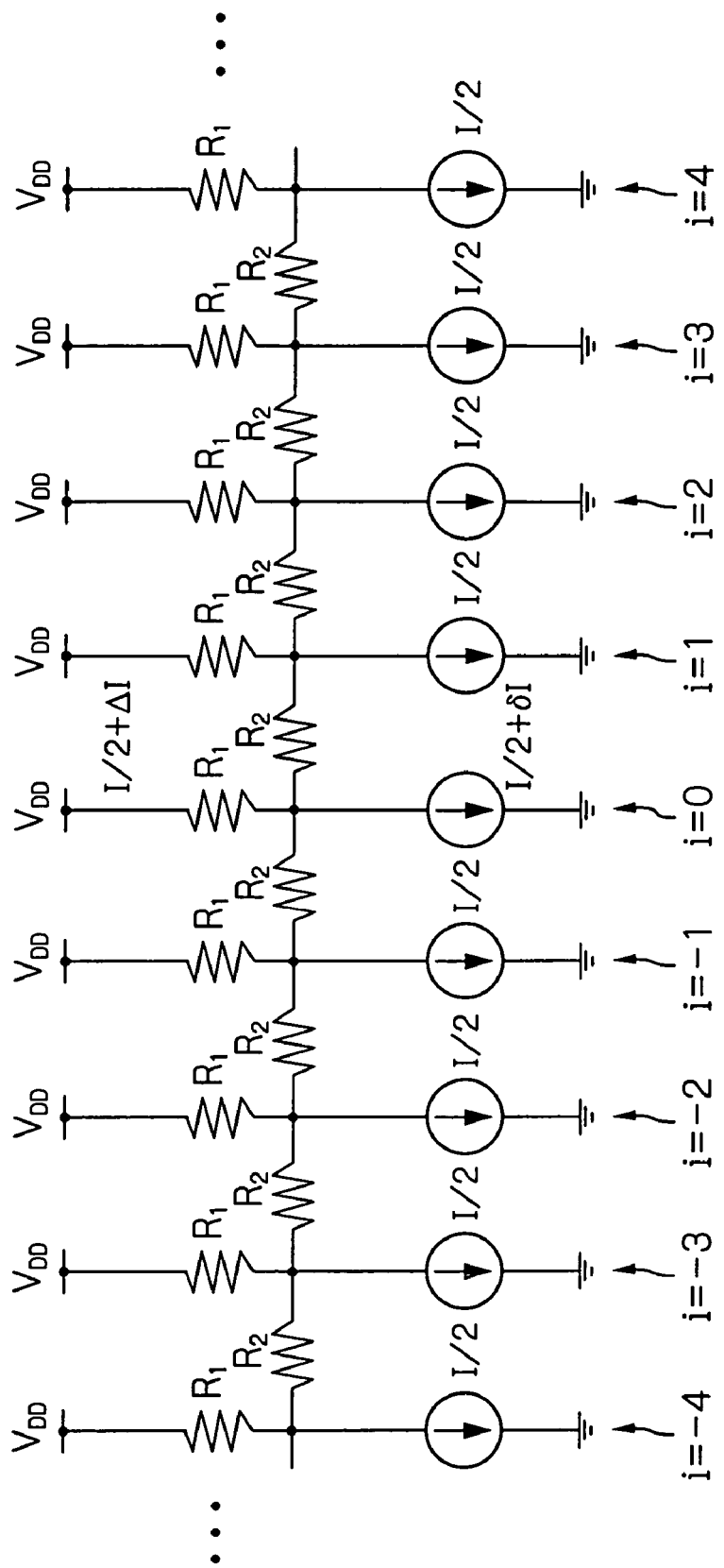
FIGS. 6A and 6B are equivalent circuit diagrams for explaining the operation of the monolithic semiconductor device of FIG. 5.

The operation of the monolithic semiconductor device of FIG. 5 is explained next with reference to FIG. 6 where there are a large number of comparators (cells) as indefinite in extent. FIG. 6A is a half circuit of FIG. 5 where only one branch of each differential pair ($Q_1$) is shown. On the other hand, FIG. 6B is a full circuit of FIG. 5 where both branches of each pair ($Q_1$ and $Q_2$) is shown.

In FIG. 6A, assume that a current flowing through the transistor $Q_1$ of the differential pair of a specified comparator 1-i is deviated from nominal and can be defined as $I/2+\delta I$ where $\delta I$ is an error current. In this case, since the error current $\delta I$ is dispersed via the resistors $R_2$ into the other comparators (cells), mismatches resulting from deviations from nominal occurring between the cells can be suppressed, which would improve the differential and integral linearity of the A/D converter of FIG. 4.

Figure 6B:
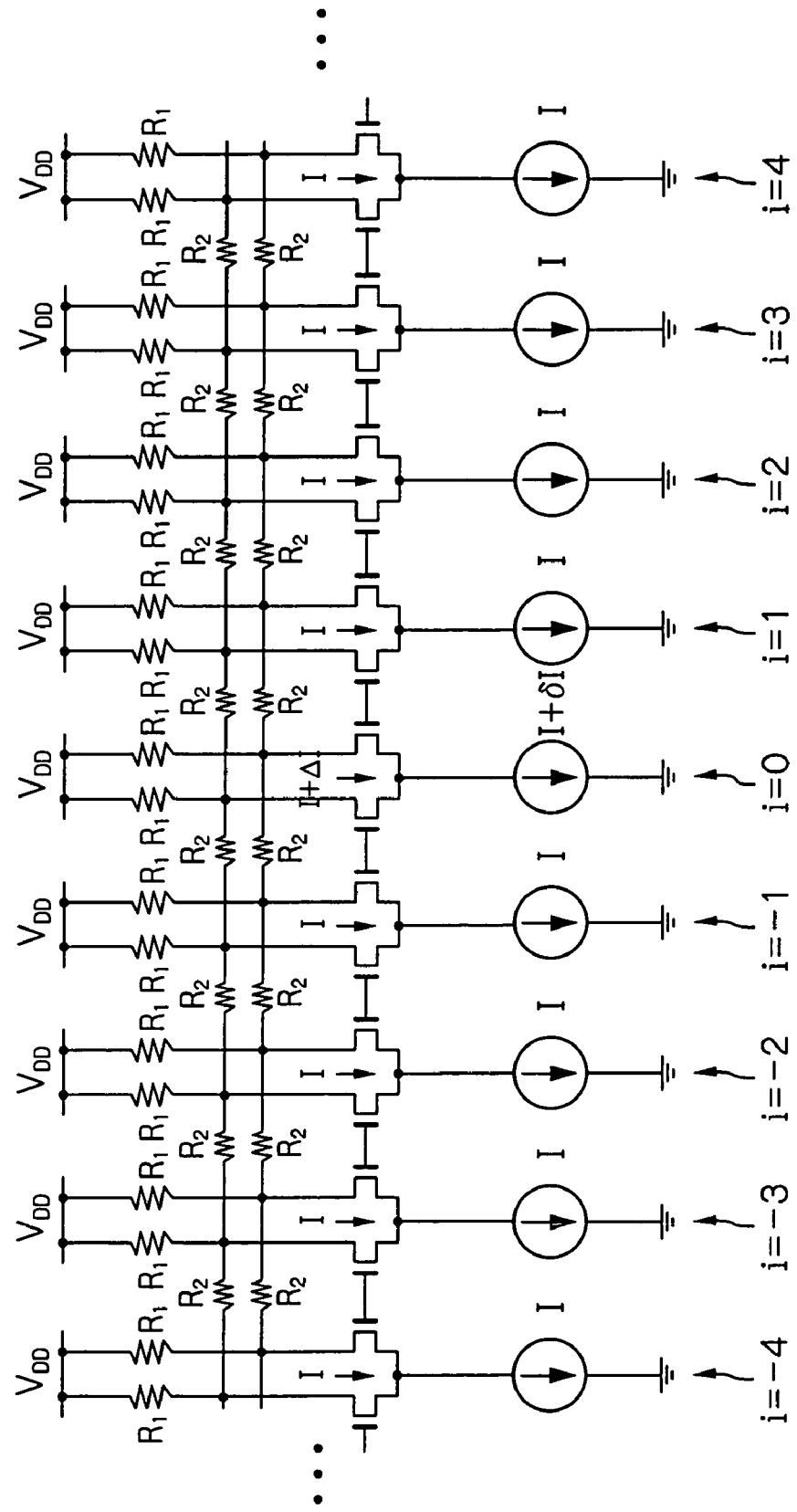

In FIG. 6B, another equivalent circuit of FIG. 5 is shown. In FIG. 6B, assume that a current flowing through the differential pair or current source of a specified comparator 1-i is deviated from nominal and can be defined as $I+\Delta I$ or $I+\delta I$ where $\Delta I$ or $\delta I$ is an error current. Here, the current flowing through the differential pair is defined as the sum of the current flowing through $Q_1$ and $Q_2$. In this case, since the error current $\Delta I$ or $\delta I$ is never dispersed into the other comparators (cells), $\Delta I=\delta I$. Therefore, mismatches resulting from deviations from nominal occurring between the cells remain. For example, differences in output common voltages or output dynamic responses between the cells would remain because the current of each cell changes independently. This would deteriorate the differential and integral linearity of the A/D converter of FIG. 4. In FIG. 4, although the mismatches resulting from deviations from nominal occurring between the differential pairs 100, 101, . . . , 107 of the cells can be suppressed, mismatches resulting deviations from nominal occurred between the current sources 200, 201, . . . , 207 cannot be suppressed.

Figure 7:
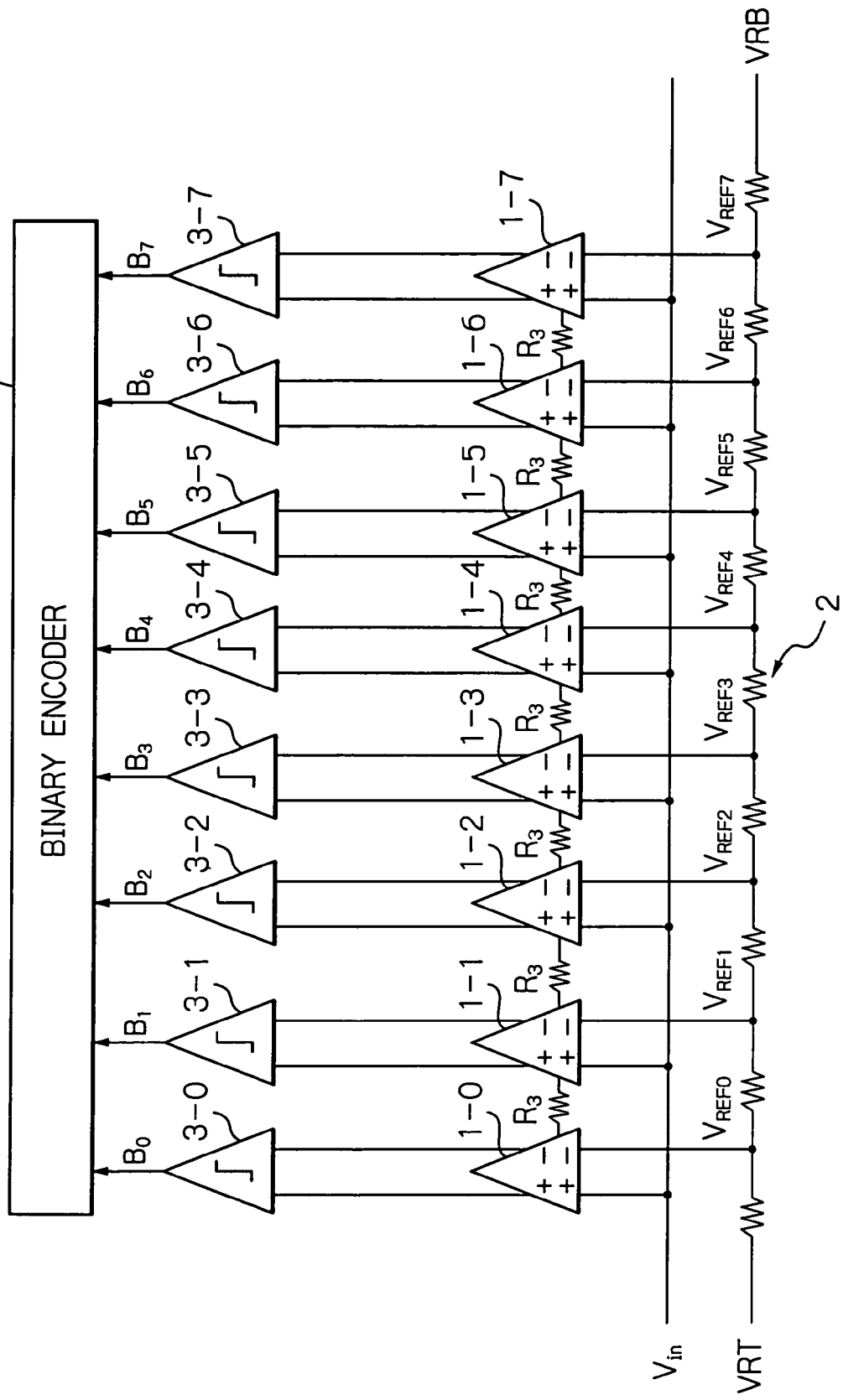
FIG. 7 is a circuit diagram illustrating a 3-bit flash or parallel A/D converter to which a first embodiment of the monolithic semiconductor device according to the present invention is applied.

In FIG. 7, which illustrates a 3-bit flash or parallel-type A/D converter to which a first embodiment of the monolithic semiconductor device according to the present invention is applied, resistors $R_3$ as impedance circuits are connected between the comparators 1-0, 1-1, . . . , 1-7 of FIG. 1. In this case, it is preferable that the resistors $R_3$ have the same value. In more detail, as shown in FIG. 8, the resistors $R_3$ are connected between nodes $N_0$, $N_1$, . . . , $N_7$ of the differential pairs 100, 101, . . . , 107 and the constant current sources 200, 201, . . . , 207.

Figure 8:
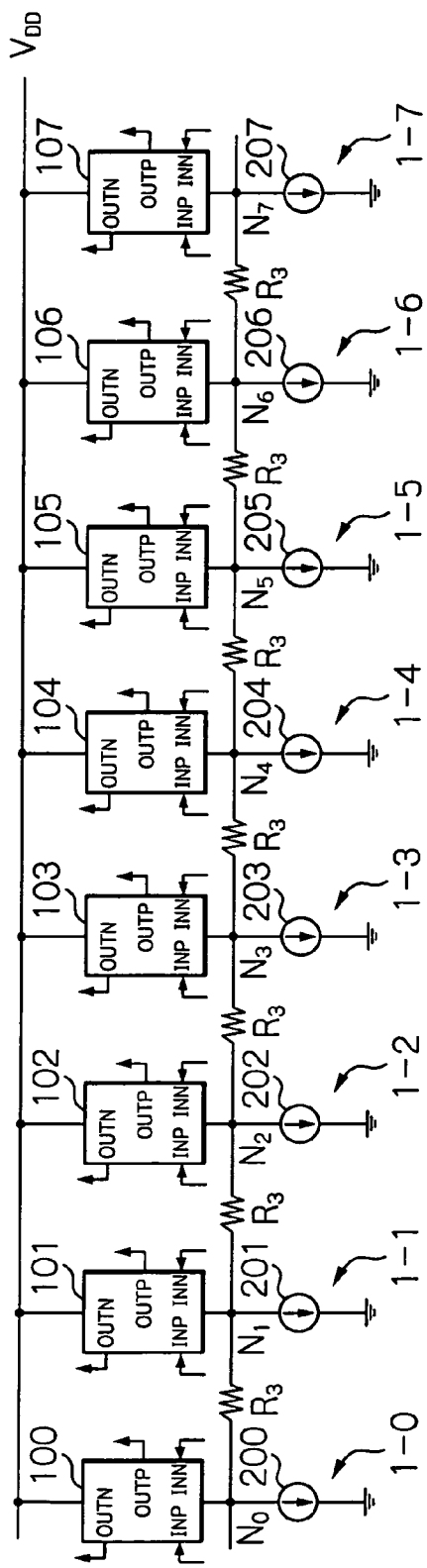
FIG. 8 is a detailed block circuit diagram of the monolithic semiconductor device of FIG. 7.
Figure 8:
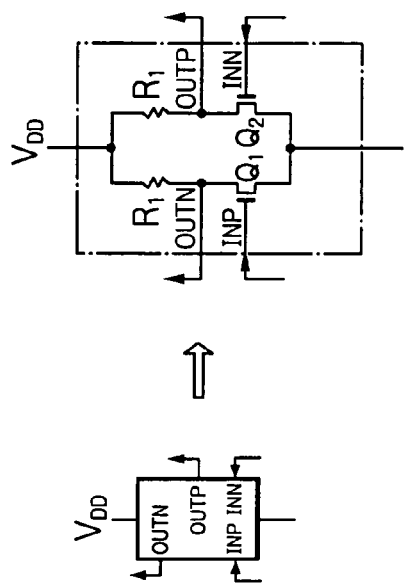

The operation of the monolithic semiconductor device of FIG. 8 is explained next with reference to FIGS. 9, 10 and 11 where there are a large number of comparators (cells) that are indefinite in extent.

Figure 9:
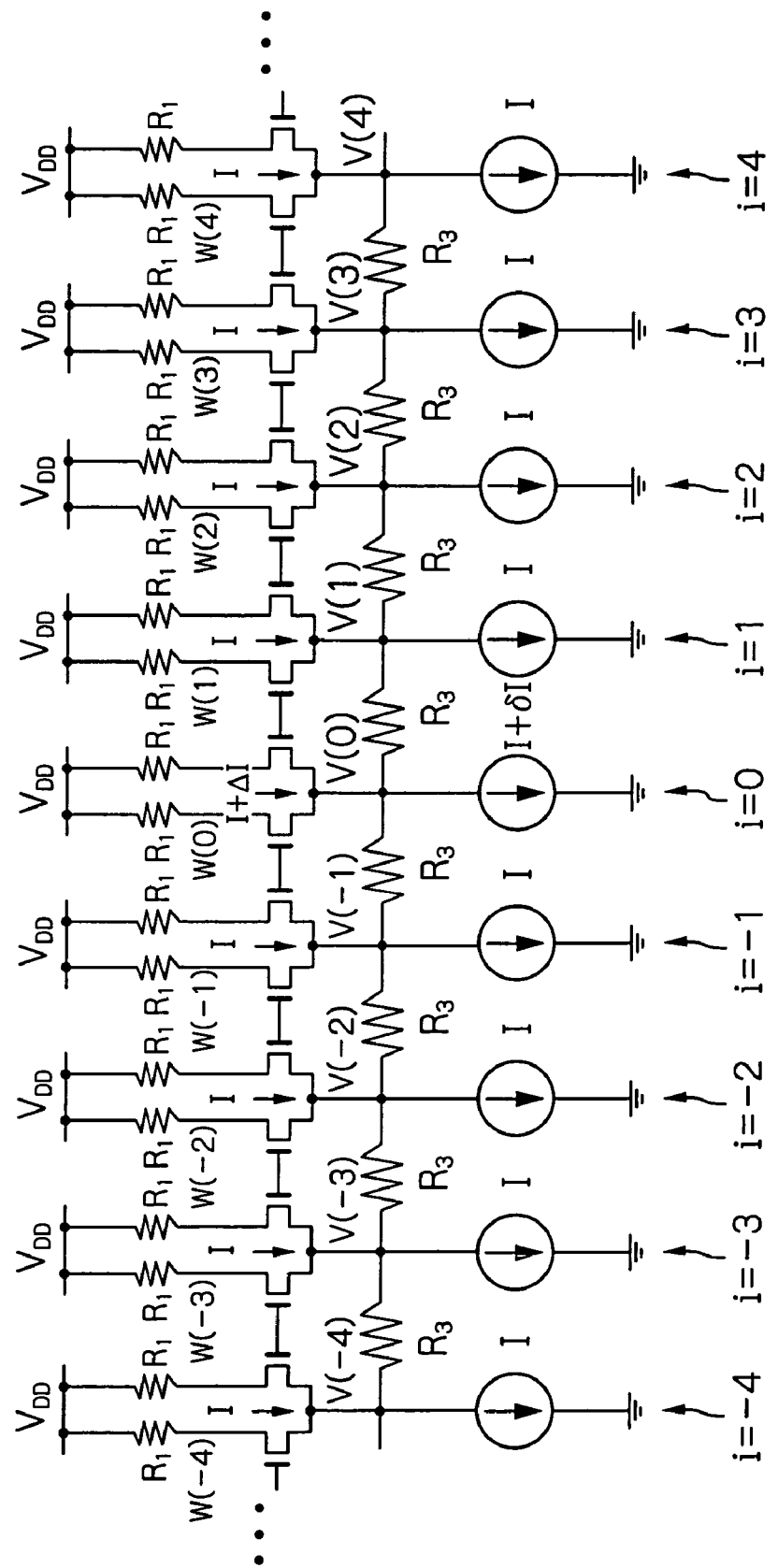
FIGS. 9, 10 and 11 are equivalent circuit diagrams for explaining the operation of the monolithic semiconductor device of FIG. 8.
Figure 10:
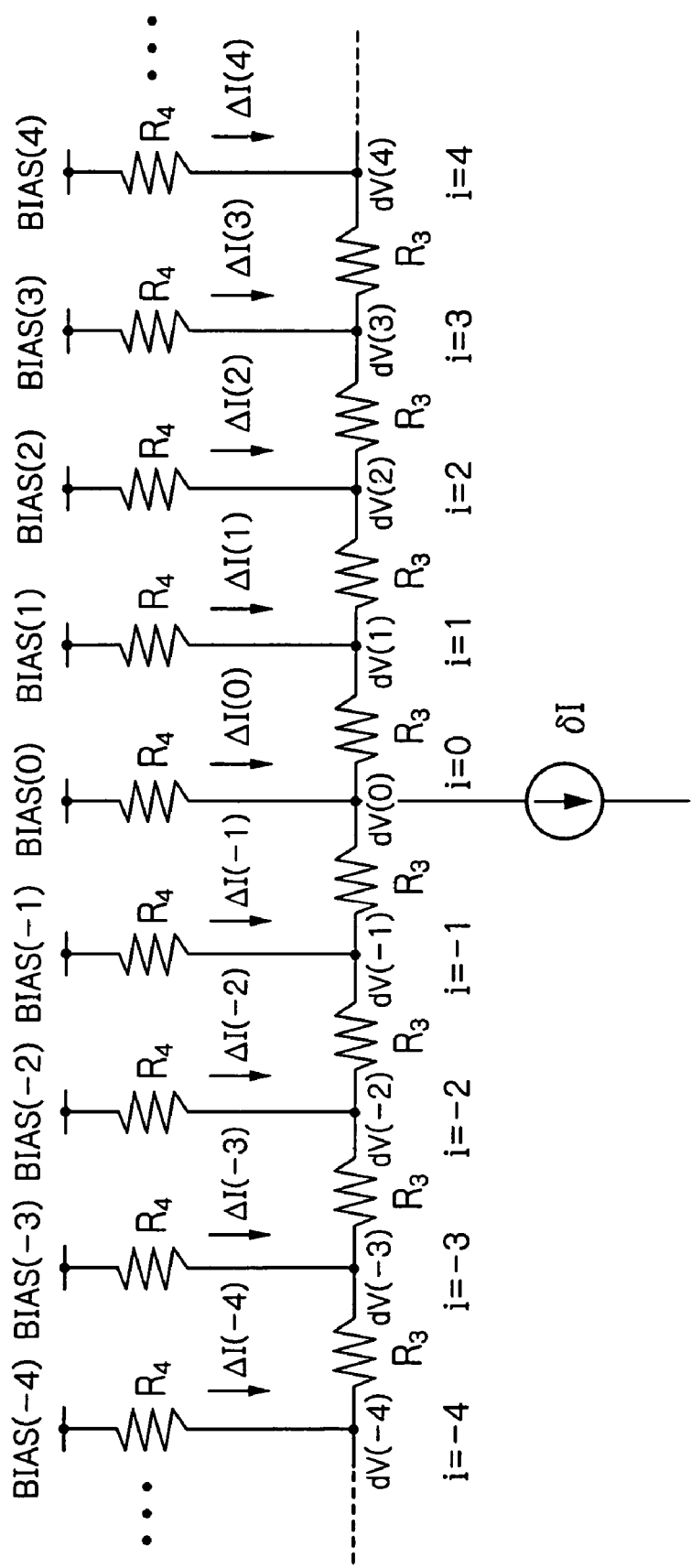

In FIG. 9, assume that a current flowing through the constant current source of a specified comparator (i=0) is deviated from nominal and can be defined as $I+\delta I$ where $\delta I$ is an error current. V(−4), V(−3), V(−2), V(−1), V(0), V(1), V(2), V(3), V(4), . . . are defined as respective voltages at the common nodes of the differential pairs, and W(−4), W(−3), W(−2), W(−1), W(0), W(1), W(2), W(3), W(4), . . . are defined as respective voltages of the output common voltages of the differential pairs.

The analysis of only the error current $\delta I$ can be carried out by the principle of superposition. That is, in FIG. 10, $\Delta I(-4)$, $\Delta I(-3)$, $\Delta I(-2)$, $\Delta I(-1)$, $\Delta I(0)$, $\Delta I(1)$, $\Delta I(2)$, $\Delta I(3)$, $\Delta I(4)$, . . . are defined as error currents flowing through the respective differential pairs of the comparators 1-i (i=−4, −3, −2, −1, 0, 1, 2, 3, 4, . . . ), and dV(−4), dV(−3), dV(−2), dV(−1), dV(0), dV(1), dV(2), dV(3), dV(4), . . . are defined as respective voltage changes at the common nodes of the differential pairs of the comparators 1-i (i=−4, −3, −2, −1, 0, 1, 2, 3, 4, . . . ) caused by $\delta I$. In FIG. 10, the differential pairs ($Q_1$, $Q_2$) and the load resistors $R_1$ are replaced as an equivalent circuit comprising bias voltage source BIAS(−4), BIAS(−3), BIAS(−2), BIAS(−1), BIAS(0), BIAS(1), BIAS(2), BIAS(3), BIAS(4) and output resistors $R_4$.

Figure 11:
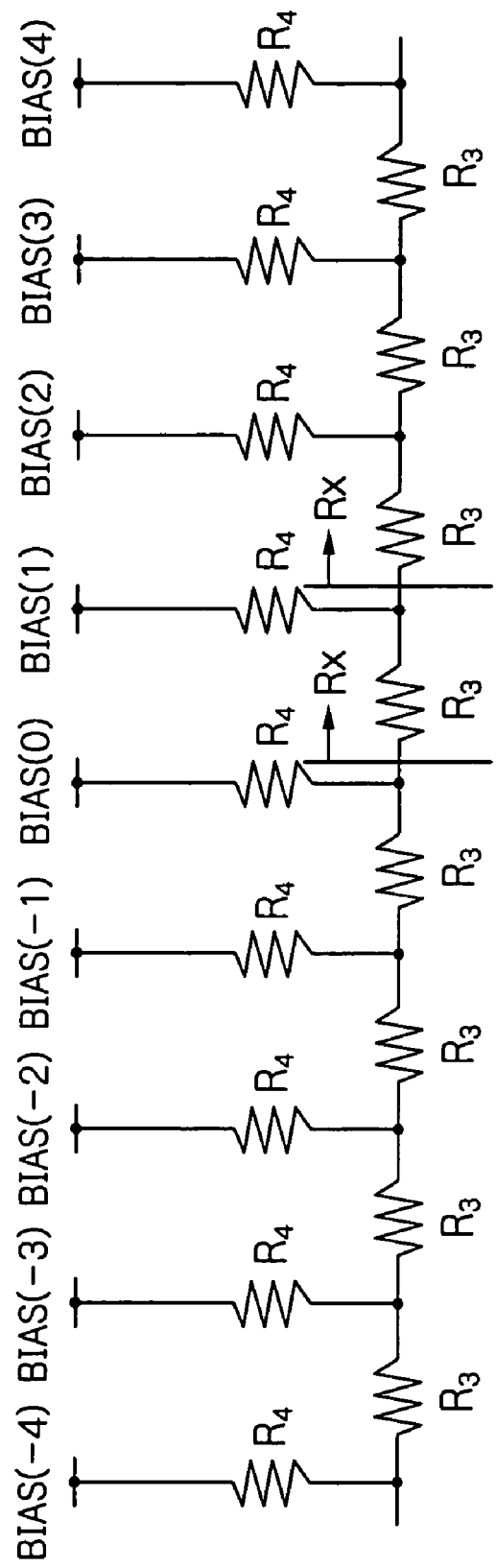

As shown in FIG. 11, it is reasonable that the impedance $R_X$ from every node is the same. As a result, $$R_X = R_3 + (R_4 // R_X)$$

$$\therefore R_X = \{R_3 + (R_3^2 + 4 \cdot R_3 \cdot R_4)^{1/2}\}/2$$

At the comparator (i=0), an error current $\Delta I(0)$ of the differential pair caused by the error current $\delta I$ can be represented by $$\Delta I(0) = \{(R_4 // R_X // R_X)/R_4\} \cdot \delta I$$

Therefore, the deviation $\delta W(0)$ of the output common voltage of the differential pair can be represented by $$\delta W(0) = (R_4 // R_X // R_X) \cdot \delta I/2$$

At the comparators (i=1 or −1), $$\Delta I(1) = \Delta I(-1) = r \cdot \Delta I(0)$$

$$\delta W(1) = \delta W(-1) = r \cdot \delta W(0)$$

where $r = (R_4 // R_X)/R_X$
Similarly, at the comparators (i=2 or −2), $$\Delta I(2) = \Delta I(-2) = r^2 \cdot \Delta I(0)$$

$$\delta W(2) = \delta W(-2) = r^2 \cdot \delta W(0)$$

Generally, at the comparators (i=n or −n), $$\Delta I(n) = \Delta I(-n) = r^n \cdot \Delta I(0)$$

$$\delta W(n) = \delta W(-n) = r^n \cdot \delta W(0)$$

Thus, as the error current $\delta I$ caused by the current source of the comparator 1-i (i=0) is dispersed via the resistors $R_3$ into its adjacent comparators (cells), and the current flowing through each differential pair becomes nearly the same value. Therefore, differences in output voltage or output dynamic response between the cells are suppressed and mismatches resulting from deviation from nominal occurring between the cells can be suppressed, which would improve the differential and integral linearity of the A/D converter of FIG. 7.

Figure 12:
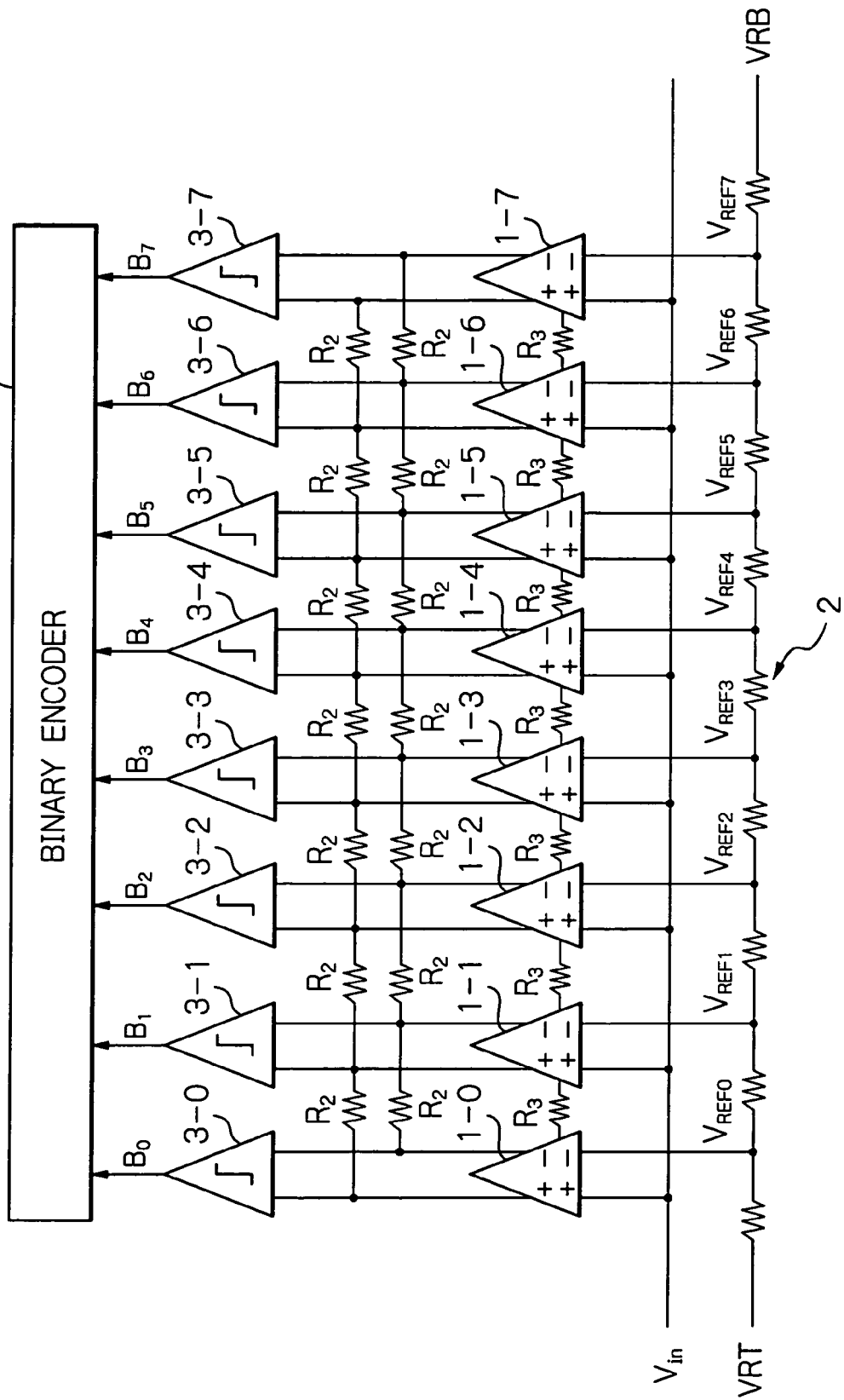
FIG. 12 is a circuit diagram illustrating a 3-bit flash or parallel A/D converter to which a second embodiment of the monolithic semiconductor device according to the present invention is applied.

In FIG. 12, which illustrates a 3-bit flash or parallel-type A/D converter to which a second embodiment of the monolithic semiconductor device according to the present invention is applied, the resistors $R_2$ of FIG. 4 as impedance circuits are added to the elements of FIG. 7. In more detail, as shown in FIG. 13, the resistors $R_2$ are connected between the outputs OUTP of the differential pairs 100, 101, ..., 107 and between the outputs OUTN of the differential pairs 100, 101, ..., 107.

Figure 13:
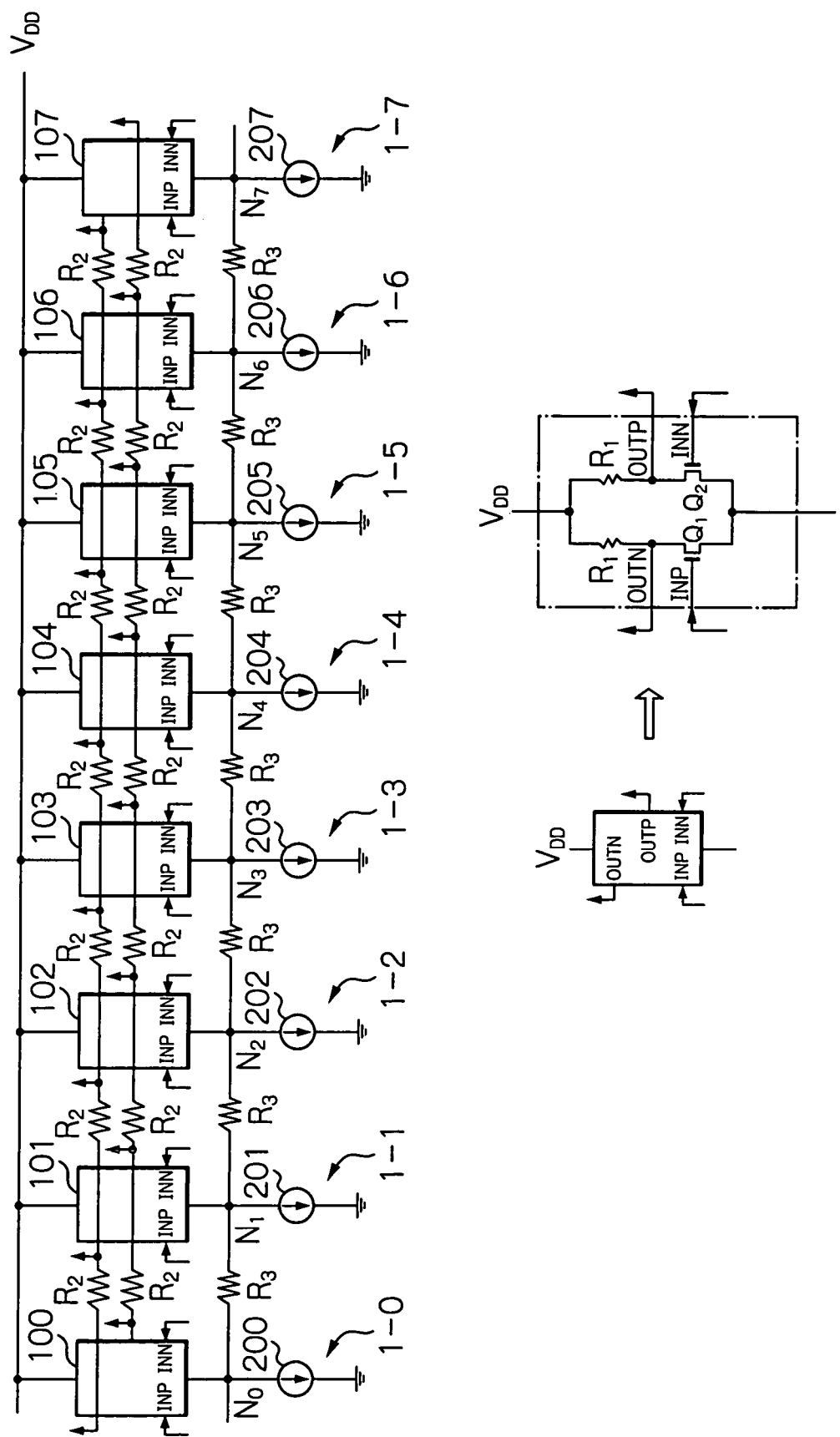
FIG. 13 is a detailed block circuit diagram of the monolithic semiconductor device of FIG. 12.

In FIGS. 12 and 13, differences in output voltage or output dynamic response between the cells are suppressed by the resistors $R_3$, and also, the mismatches resulting from deviation from nominal occurring between the cells are suppressed by the resistors $R_2$. Thus, the differential and integral linearity of the A/D converter would be further improved.

In the above-described embodiments, the differential pairs can be formed by bipolar transistors. Also, the present invention can be applied to other repetitive cells than the comparators of a flash or parallel-type A/D converter, such as a memory cell, a gate array, a logic gate or a register having differential pairs and constant current sources.

As explained hereinabove, according to the present invention, mismatches between repetitive cells can be suppressed.

What is claimed is:

1. A monolithic semiconductor device, comprising:
    a plurality of repetitive cells each including one differential transistor pair and one current source connected to said differential transistor pair for supplying a current to said differential transistor pair; and
    a plurality of first impedance circuits, each connected between the current sources of two of said repetitive cells, for reducing the effect of cell mismatches among said repetitive cells.

2. The monolithic semiconductor device as set forth in claim 1, wherein said first impedance circuits comprise equal-valued resistors.

3. The monolithic semiconductor device as set forth in claim 1, further comprising a plurality of second impedance circuits, each connected between the differential transistor pairs of two of said repetitive cells, for further reducing the cell mismatches among said repetitive cells.

4. The monolithic semiconductor device as set forth in claim 3, wherein said second impedance circuits comprise equal-valued resistors.

5. The monolithic semiconductor device as set forth in claim 1, wherein each of said repetitive cells further comprises:
    first and second loads each connected to first and second transistors, respectively, of said differential transistor pair,
    said first transistor being controlled by an input voltage to provide a first output signal at a first output terminal,
    said second transistor being controlled by a reference voltage to provide a second output signal at a second output terminal.

6. The monolithic semiconductor device as set forth in claim 5, wherein each of said repetitive cells forms a comparator for a flash analog/digital converter.

7. The monolithic semiconductor device as set forth in claim 5, further comprising a plurality of second impedance circuits, each connected between the first output terminals of two of said repetitive cells and between the second output terminals of two of said repetitive cells, for further reducing the cell mismatches among said repetitive cells.

8. The monolithic semiconductor device as set forth in claim 7, wherein said second impedance circuits comprise equal-valued resistors.

* * * * *